(12) United States Patent
Hironaka et al.

(10) Patent No.: US 8,096,840 B2
(45) Date of Patent: Jan. 17, 2012

(54) CONDUCTIVE CONTACT HOLDER AND CONDUCTIVE CONTACT UNIT

(75) Inventors: Kohei Hironaka, Nagano (JP); Toru Nakamura, Nagano (JP); Mitsuhiro Kondo, Nagano (JP)

(73) Assignee: NHK Spring Co., Ltd., Yokohama-shi (JP)

( * ) Notice: Subject to any disclaimer, the term of this patent is extended or adjusted under 35 U.S.C. 154(b) by 0 days.

(21) Appl. No.: 12/450,602

(22) PCT Filed: Apr. 4, 2008

(86) PCT No.: PCT/JP2008/056769
§ 371 (c)(1),
(2), (4) Date: Mar. 26, 2010

(87) PCT Pub. No.: WO2008/123608
PCT Pub. Date: Oct. 16, 2008

(65) Prior Publication Data
US 2010/0184306 A1      Jul. 22, 2010

(30) Foreign Application Priority Data

Apr. 4, 2007   (JP) ................................ 2007-098726

(51) Int. Cl.
*H01R 13/40* (2006.01)
(52) U.S. Cl. ...................................... 439/750; 439/198
(58) Field of Classification Search ............. 324/750.08, 324/756.02; 439/140, 190–198
See application file for complete search history.

(56) References Cited

U.S. PATENT DOCUMENTS

| | | | |
|---|---|---|---|
| 5,500,605 A * | 3/1996 | Chang | 324/754.14 |
| 6,292,003 B1 * | 9/2001 | Fredrickson et al. | 324/750.25 |
| 6,932,635 B2 | 8/2005 | Ishikawa et al. | |
| 6,998,857 B2 | 2/2006 | Terada et al. | |
| 2004/0077200 A1 * | 4/2004 | Ishikawa et al. | 439/190 |
| 2006/0228914 A1 * | 10/2006 | Oda | 439/71 |
| 2006/0255822 A1 * | 11/2006 | Saito et al. | 324/760 |

FOREIGN PATENT DOCUMENTS

| | | |
|---|---|---|
| JP | 61-065173 | 4/1986 |
| JP | 61-065174 | 4/1986 |
| JP | 2000-284020 | 10/2000 |
| JP | 2001-051017 | 2/2001 |
| JP | 2002-107377 | 4/2002 |
| JP | 2002-236140 | 8/2002 |
| KR | 20-0405297 Y1 | 1/2006 |

OTHER PUBLICATIONS

International Search Report dated Jul. 8, 2008 issued in International Patent Application No. PCT/JP2008/056769.
Notice of Allowance for KR 10-2009-7022794 issued Oct. 18, 2011.

* cited by examiner

*Primary Examiner* — Renee S Luebke
*Assistant Examiner* — Larisa Tsukerman
(74) *Attorney, Agent, or Firm* — Edwards Wildman Palmer LLP

(57) ABSTRACT

Provided are a conductive contact holder and a conductive contact unit that enable a test to be performed in a precise temperature environment. For this objective, a construction includes a holder substrate that individually receives plural conductive contacts, and a floating member attached to the holder substrate such that a distance from a surface of the holder substrate is varied within a predetermined range by an external force. The floating member has plural hole sections into which a front end section of each of the conductive contacts received in the holder substrate is inserted. A gap between the holder substrate and the floating member forms at least a part of a passage of fluid introduced from outside of the conductive contact holder.

7 Claims, 12 Drawing Sheets

CONDUCTIVE CONTACT HOLDER AND CONDUCTIVE CONTACT UNIT

TECHNICAL FIELD

The present invention relates to a conductive contact holder and a conductive contact unit for holding a conductive contact used in an electric conduction test of a circuit structure of a semiconductor integrated circuit and the like.

BACKGROUND ART

In an electric property test of a semiconductor integrated circuit such as an IC chip, a conductive contact unit is used, which holds a plurality of conductive contacts on predetermined locations corresponding to installation patterns of external connection electrodes of the semiconductor integrated circuit. The conductive contact unit includes a conductive contact holder that has a plurality of hole sections in which the respective conductive contacts are inserted. In the conductive contact unit, both ends of each conductive contact are brought into contact with a connection electrode of the semiconductor integrated circuit and an electrode of a test circuit substrate, respectively, thereby establishing electric connection during the test and performing communication of signals (e.g., refer to Patent Document 1).

Patent Document 1: Japanese Patent Application Laid-open No. 2002-107377

DISCLOSURE OF INVENTION

Problem to be Solved by the Invention

In recent years, a temperature range used in a test of a semiconductor integrated circuit has increased gradually. For example, there is a case where a semiconductor integrated circuit is tested in a high temperature environment above 125° C. and also in a low temperature environment of approximately −40° C. In the test, when the semiconductor integrated circuit is mounted on the conductive contact unit, the temperature of the semiconductor integrated circuit is directly transferred to the conductive contact. Accordingly, if a temperature difference is great between the conductive contact and the semiconductor integrated circuit, the temperature of the semiconductor integrated circuit changes rapidly. This makes it difficult to test the semiconductor integrated circuit in a precise temperature environment.

The present invention has been made in view of the above, and an object of the present invention is to provide a conductive contact holder and a conductive contact unit that enable a test to be performed in a precise temperature environment.

Means for Solving Problem

To solve the problem described above and achieve the object, a conductive contact holder according to the present invention supporting a plurality of conductive contacts for electrically connecting different circuit structures to input and output signals includes a holder substrate capable of individually receiving the conductive contacts; and a floating member attached to the holder substrate such that a distance from a surface of the holder substrate is varied within a predetermined range by an external force, the floating member having a plurality of hole sections into which a front end section of each of the conductive contacts received in the holder substrate is inserted, wherein a gap between the holder substrate and the floating member forms at least a part of a passage of fluid introduced from outside of the conductive contact holder.

In the conductive contact holder according to the present invention as set forth in the invention described above, the holder substrate includes first and second substrates that are tabular-shaped and stacked in a direction of plate thickness, and a gap formed between the stacked first and second substrates forms at least a part of the passage of fluid introduced from the outside of the conductive contact holder.

In the conductive contact holder according to the present invention as set forth in the invention described above, the holder substrate includes a protrusion in the gap formed between the first and second substrates, the protrusion protruding in a height direction of the gap from at least one of the first and second substrates.

In the conductive contact holder according to the present invention as set forth in the invention described above, the floating member has an opening section penetrating the floating member in a thickness direction.

A conductive contact unit according to the present invention includes a plurality of conductive contacts for electrically connecting different circuit structures to input and output signals; a conductive contact holder as set forth in the above; and a base member having an opening section, into which one of the circuit structures electrically connected by the conductive contacts is mountable, and an inlet of the fluid introduced from the outside to the conductive contact holder, wherein the base member applies a load to the floating member in a direction toward the holder substrate.

In the conductive contact unit according to the present invention as set forth in the invention described above, the base member has a plurality of the inlets that have portions adjacent to the conductive contact holder, the portions extending in parallel and central axes thereof being shifted from each other.

In the conductive contact unit according to the present invention as set forth in the invention described above, a fluid generator that generates the fluid introduced to the conductive contact holder through the inlet of the base member is further included, wherein the fluid generator generates the fluid having a temperature in a temperature range that is set for the circuit structure mounted into the opening section of the base member.

Effect of the Invention

According to the present invention, the floating member is attached to the holder substrate such that the distance from the surface of the holder substrate, which receives the conductive contacts, is varied within a predetermined range by an external force, and the gap between the floating member and the holder substrate forms at least a part of the flow passage for the fluid introduced from the outside. Consequently, by flowing fluid of temperature nearly the same as that of the circuit structure to be tested through the gap, the temperature of the conductive contact is allowed to approach to that of the circuit structure to be tested. As a result, it becomes possible to prevent sudden temperature change of the semiconductor integrated circuit during the test, and to perform the test in a precise temperature environment.

Figure 1:
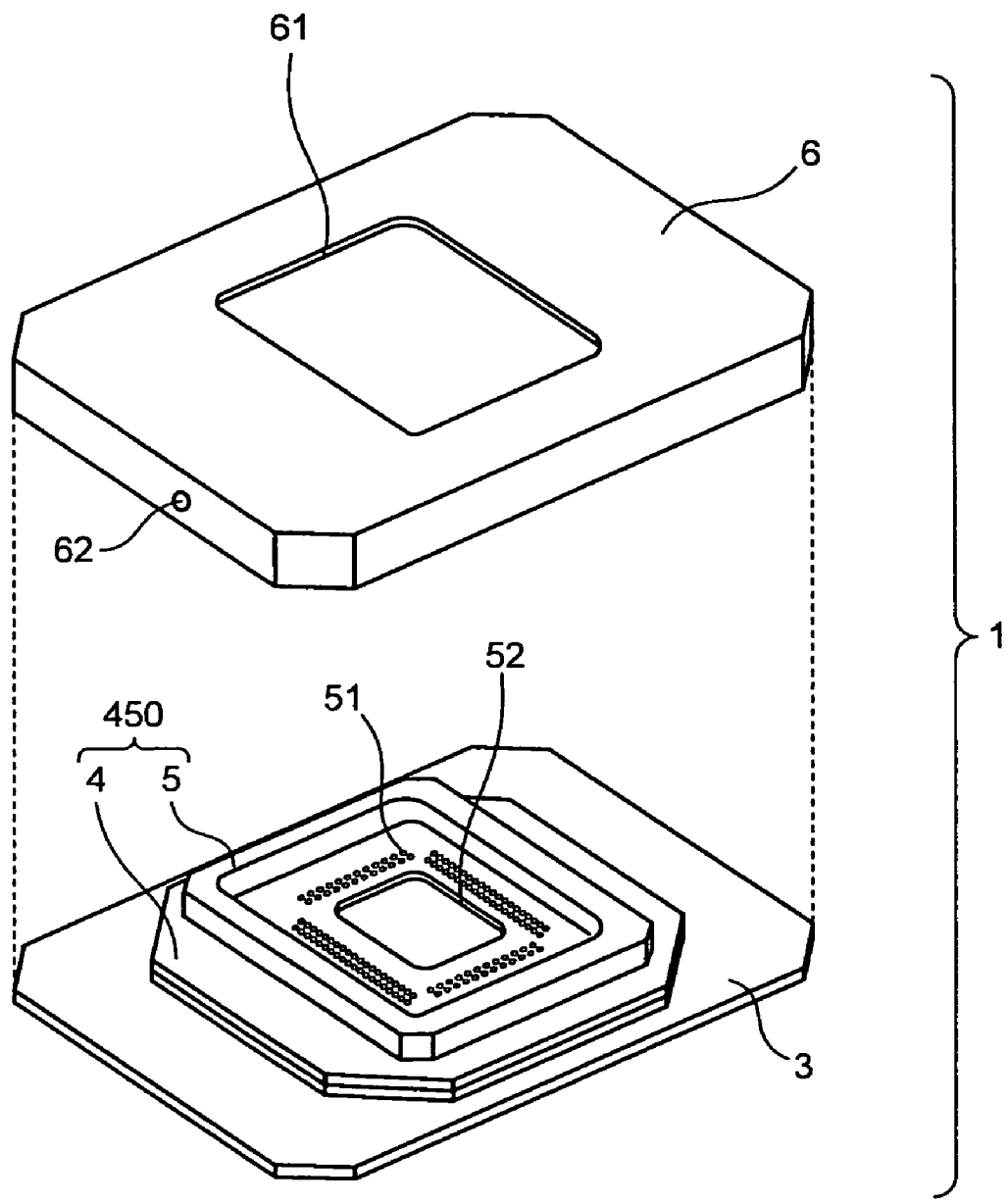
FIG. 1 is a perspective view illustrating a construction of a conductive contact unit according to a first embodiment of the invention.

EXPLANATIONS OF LETTERS OR NUMERALS 1, 10 Conductive contact unit
2 Conductive contact
3 Circuit substrate
4, 11 Holder substrate
5, 7, 8, 9 Floating member
6, 12, 16, 26 Base member
21 First plunger
22 Second plunger
21a, 22a Front end section
21b, 22b Flange section
21c, 22c Boss section
21d, 22d Base end section
23 Spring member
23a Loose coil section
23b Dense coil section
31 Electrode
41, 111 First substrate
42, 112 Second substrate
51, 71, 81, 91 Hole section
52, 61, 72, 82, 92, 121, 161, 261 Opening section
62, 122, 162, 262 Air passage
101 Nozzle
102 Hose
103 Air generator
111a, 112a Recess section
111b Protrusion section
113, 114, 411, 421 Holder hole
113a, 114a, 411a, 421a Small diameter hole
113b, 114b, 411b, 421b Large diameter hole
450 Conductive contact holder
Sp, Sp2 Gap

BEST MODE(S) FOR CARRYING OUT THE INVENTION

Hereinafter, best modes (hereinafter, referred to as "embodiment") for carrying out the invention will be described with reference to the accompanying drawings. The drawings are illustrated schematically, and thus, it should be noted that the relation between a thickness and a width of any part, the ratio of thicknesses of any parts, and the like may be different from an actual case, and a relation and a ratio of dimensions may also be different in the respective drawings.

First Embodiment

Figure 2:
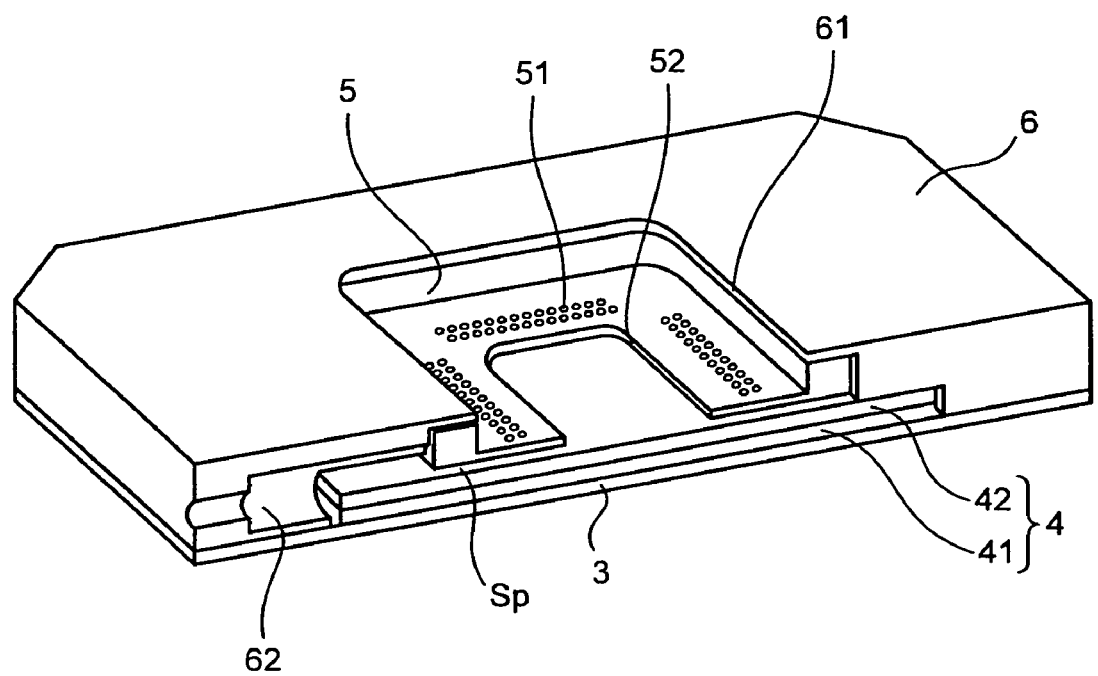
FIG. 2 is a schematic view illustrating an internal construction of a conductive contact unit according to the first embodiment of the invention.
Figure 3:
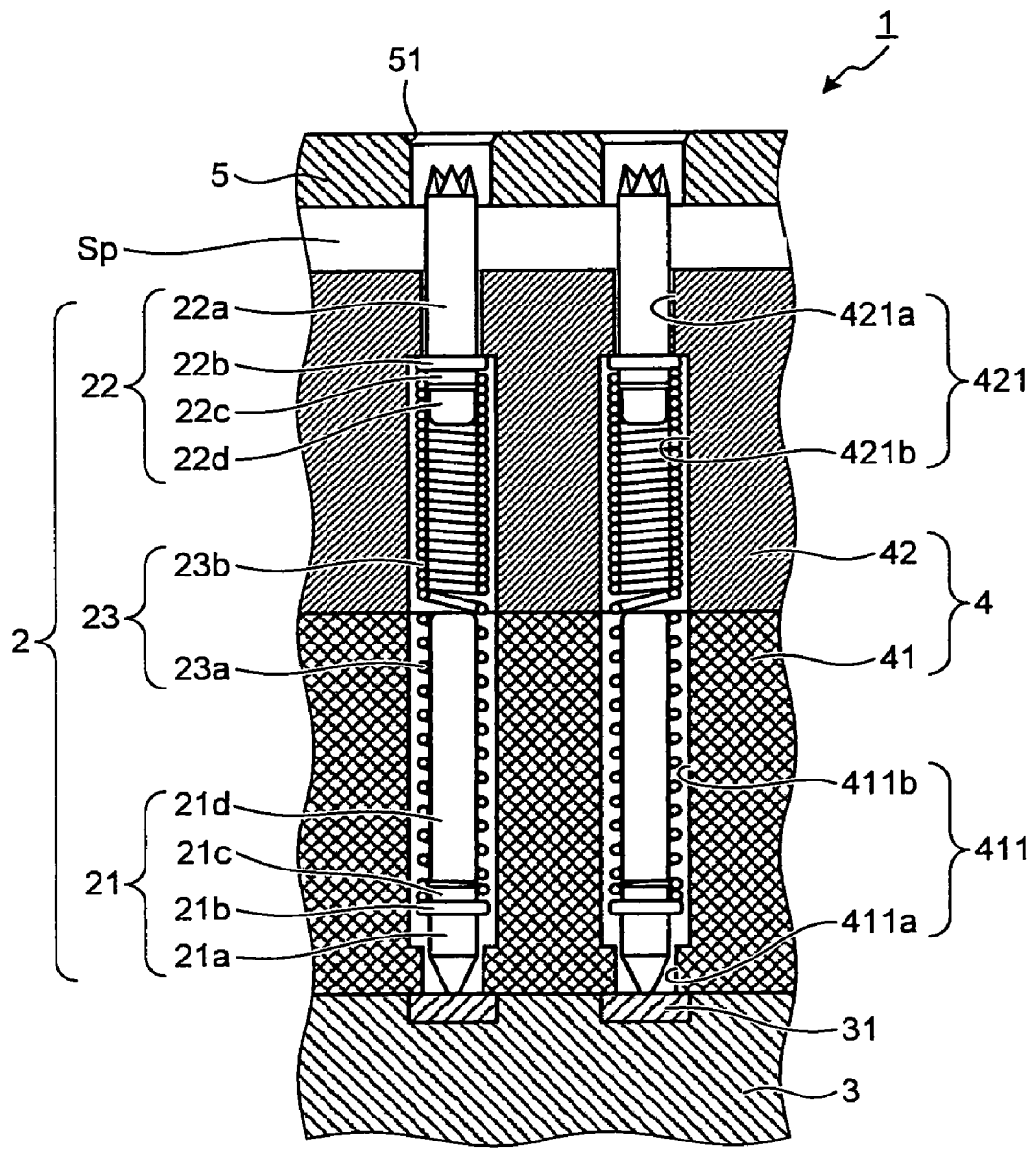
FIG. 3 is a detailed partial cross-sectional view illustrating a construction of a conductive contact and peripheral portions thereof.

FIG. 1 is a perspective view illustrating a construction a conductive contact unit according to a first embodiment of the invention. FIG. 2 is a schematic view illustrating an internal construction of the conductive contact unit. FIG. 3 is a detailed partial cross-sectional view illustrating a construction a conductive contact and peripheral portions thereof. The conductive contact unit 1 illustrated in FIGS. 1 to 3 is applied to an electric property test of a semiconductor integrated circuit such as an IC chip, and is also referred to as a test socket.

The conductive contact unit 1 includes a plurality of conductive contacts 2, a circuit substrate 3, a holder substrate 4, a floating member 5, and a base member 6. The conductive contact 2 connects a semiconductor integrated circuit, which is a circuit structure of a test target, and a signal processing circuit, which is a circuit structure that generates a test signal, to perform signal communication. The circuit substrate 3 outputs the test signal received from the signal processing circuit, as a signal to be supplied to the semiconductor integrated circuit, through the conductive contact 2. The holder substrate 4 is disposed on the circuit substrate 3 and receives and supports the conductive contacts 2. The floating member 5 is tabular-shaped and attached such that a distance between a surface of the holder substrate 4 on an opposite side to the circuit substrate 3 and a surface of the floating member 5 can be varied within a predetermined range by an external force. The base member 6 is provided to cover a periphery of the holder substrate 4 and the floating member 5 from above the floating member 5.

The conductive contact 2 includes a first plunger 21, a second plunger 22, and a spring member 23. The first plunger 21 is formed of conductive material such as iron, and is brought into contact with an electrode 31 provided on the circuit substrate 3. The second plunger 22 protrudes in a direction opposite to the first plunger 21, and is brought into contact with an electrode provided on the semiconductor integrated circuit. The spring member 23 is provided between the first plunger 21 and the second plunger 22 to electrically connect the first plunger 21 and the second plunger 22 and to elongate and contract the conductive contact 2 in a longitudinal direction.

The first plunger 21 includes a front end section 21a, a flange section 21b, a boss section 21c, and a base end section 21d, and is asymmetric about a central axis parallel to the longitudinal direction. The front end section 21a has a sharp-pointed end. The flange section 21b has a diameter greater than that of the front end section 21a. The boss section 21c protrudes from the flange section 21b in a direction opposite to the front end section 21a, and has a columnar shape with a diameter smaller than that of the flange section 21b and slightly greater than an inner diameter of the spring member 23. An end of the spring member 23 is forced into the boss section 21c. The base end section 21d has a columnar shape with a diameter smaller than both a diameter of the boss section 21c and an inner diameter of the spring member 23.

The second plunger 22 includes a front end section 22a, a flange section 22b, a boss section 22c, and a base end section 22d, and is asymmetric about a central axis parallel to the longitudinal direction. The front end section 22a has a crown shape. The flange section 22b has a diameter greater than that of the front end section 22a. The boss section 22c protrudes from the flange section 22b in a direction opposite to the front end section 22a, and has a columnar shape with a diameter smaller than that of the flange section 22b and slightly greater than an inner diameter of the spring member 23. An end of the spring member 23 is press fit onto the boss section 22c. The base end section 22d has a columnar shape with a diameter smaller than both a diameter of the boss section 22c and an inner diameter of the spring member 23. Incidentally, the front end section may also have a sharp-pointed end, like the front end section 21a of the first plunger 21.

The spring member 23 is a coil spring with a constant diameter. A portion of the spring member around the first plunger 21 is a loose coil section 23a, and a portion of the spring member around the second plunger 22 is a dense coil section 23b. An end of the loose coil section 23a is press fit onto the boss section 21c of the first plunger 21, and an end of the dense coil section 23b is press fit onto the boss section 22c of the second plunger 22. Consequently, the spring member 23 connects the first plunger 21 and the second plunger 22.

The conductive contacts 2 are classified into a signal conductive contact for inputting/outputting test electric signals to/from the semiconductor integrated circuit, an earth conductive contact for applying an earth potential to the semiconductor integrated circuit, and a supply conductive contact for supplying an electric power to the semiconductor integrated circuit. Because there is no essential difference among the various kinds of conductive contacts, the various kinds of conductive contacts received in the holder substrate 4 are referred to generically as "conductive contact 2" in the first embodiment. This will be the same in a second embodiment described later and others.

When a semiconductor integrated circuit is set on the conductive contact unit 1 to apply load thereto, in the conductive contact 2, the spring member 23 is bent so that at least a part of the dense coil section 23b is brought into contact with the base end section 21d of the first plunger 21. As a result, electric conduction is established through the shortest path sequentially passing through the first plunger 21, the dense coil section 23b of the spring member 23, and the second plunger 22.

The holder substrate 4 includes a first substrate 41 and a second substrate 42 which are stacked in a direction of plate thickness, and attached to each other using, although not shown in the drawings, a screw or an adhesive. In general, the first substrate 41 and the second substrate 42 have different thicknesses.

In the first substrate 41, a holder hole 411 is provided, which penetrates the first substrate 41 in a direction of plate thickness and receives and supports a part of the conductive contact 2. The holder hole 411 has an opening in a surface of the first substrate 41 not in contact with the second substrate 42, and has a shape of a stepped hole including a small diameter hole 411a into which the front end section 21a of the first plunger 21 can be inserted and a large diameter hole 411b with a diameter larger than that of the small diameter hole 411a. The small diameter hole 411a and the large diameter hole 411b have a circular cross section.

In the second substrate 42, a holder hole 421 is provided, which penetrates the second substrate 42 in a direction of plate thickness and receives and supports a part of the conductive contact 2. The holder hole 421 has an opening in a surface of the second substrate 42 not in contact with the first substrate 41, and has a shape of a stepped hole including a small diameter hole 421a into which the front end section 22a of the second plunger 22 can be inserted and a large diameter hole 421b with a diameter larger than that of the small diameter hole 421a. The plurality of holder holes 421 communicate coaxially with the plurality of holder holes 411 provided in the first substrate 41, respectively.

The holder holes 411 and 421 are formed by drilling, etching, or punching, or by processing using laser, electron beam, ion beam, wire electric discharge, and the like.

The floating member 5 includes a plurality of hole sections 51 which are formed corresponding to the arrangement pattern of connection electrodes of the semiconductor integrated circuit. The hole section 51 has a diameter enough to receive the connection electrode of the semiconductor integrated circuit. The floating member 5 serves to determine an approximate location before the connection electrodes are brought into contact with the conductive contact 2. Thus, if the hole section 51 is formed to have a taper-shaped cross section, the surface of the connection electrode can be prevented from being damaged by the contact with the floating member 5.

In a gap Sp between a periphery of the floating member 5 and a periphery of the holder substrate 4, an elastic element (not shown) such as a spring is interposed. During the non-testing period when the semiconductor integrated circuit is not mounted, the floating member 5 floats up and is separated from the surface of the holder substrate 4 (see FIG. 3).

The floating member 5 has an opening section 52 penetrating a central region thereof in a direction of plate thickness. The opening section 52 serves to flow out gas, such as air, to the outside through the gap between the holder substrate 4 and the floating member 5.

The holder substrate 4 and the floating member 5 form at least a part of a conductive contact holder 450 of the first embodiment.

Figure 4:
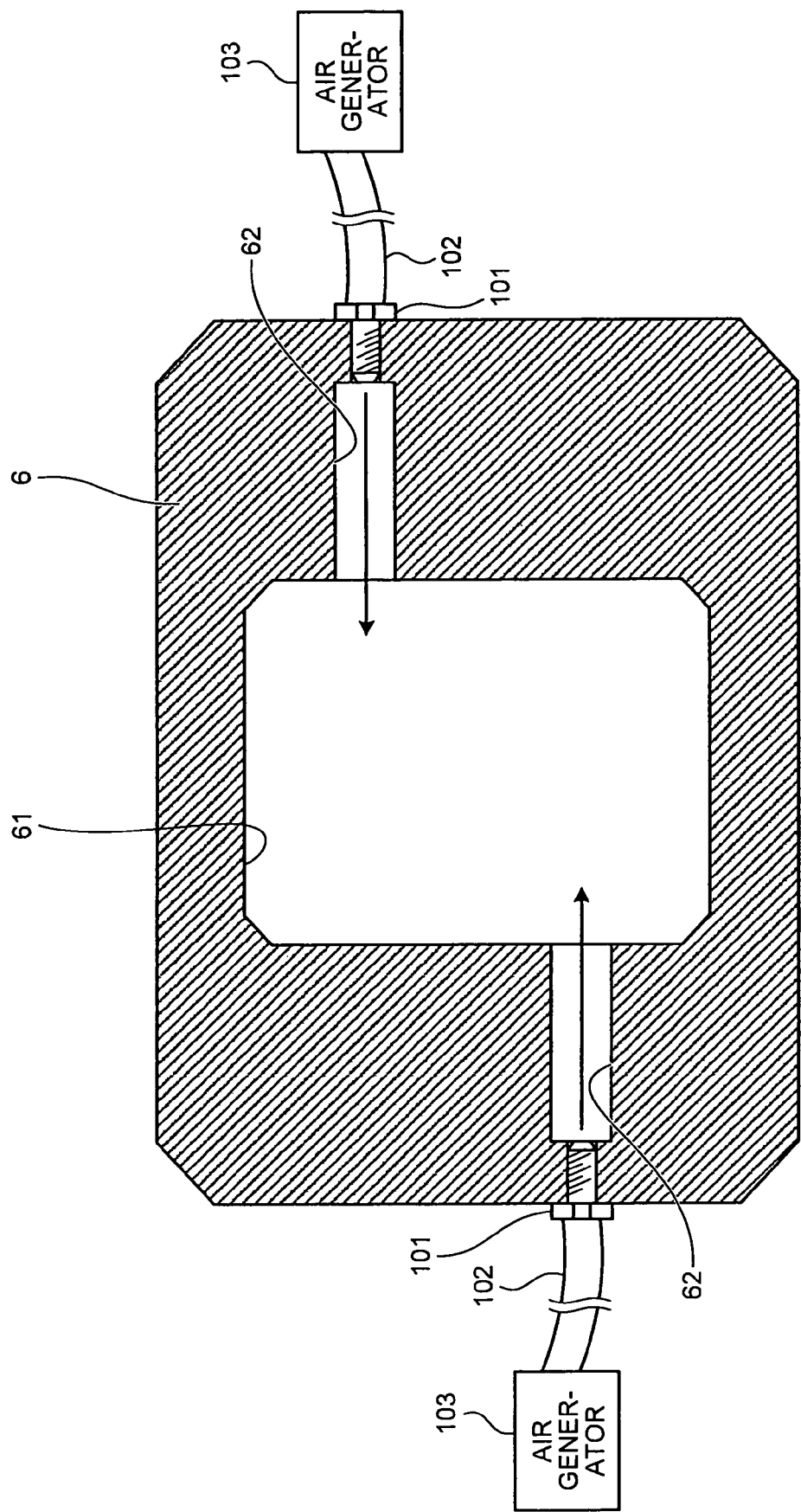
FIG. 4 is a schematic view illustrating an internal construction of a base member.

FIG. 4 is a view illustrating an internal construction of the base member 6, and is a sectional view (cross sectional view) taken along a plane which passes through a center of a plate of the base member 6 and is perpendicular to a direction of plate thickness. In the center region, the base member 6 is provided with an opening section 61 that allows a semiconductor integrated circuit to be mounted on the conductive contact unit 1, and also allows peripheries of the holder substrate 4 and the floating member 5 to be covered and fitted. An area of the opening section 61 on a surface of the base member 6 is slightly smaller than an area within an outer edge of the floating member 5 (see FIG. 1).

On the base member 6, two air passages 62 are provided, which penetrate the base member 6 from an outer side thereof to an inner side on the side of the opening section 61 to receive air from the outside. The two air passages 62 extend in parallel, but central axes of the two air passages 62 are shifted.

To the air passage 62, a nozzle 101 is coupled from the outside. The nozzle 101 is coupled, via a hose 102, to an air generator 103 that generates air. The air generator 103 can arbitrary control to change temperature, flow velocity (flow rate), pressure, and the like of generated air. Particularly, the air generator 103 can generate air within a temperature range used in a test of a semiconductor integrated circuit. In this sense, the air generator 103 forms at least a part of a fluid generator. Air having a temperature desired for the conductive contact unit 1 can be introduced by the air generator 103 thus provided. Although two air generators 103 are described in FIG. 4, only one air generator 103 may supply air to the two air passages 62.

Air generated by the air generator 103 is preferably clean dry air with low humidity. Alternatively, nitrogen gas may be used as fluid instead of air in the embodiment.

The base member 6 serves to inhibit misalignment of the semiconductor integrated circuit to be tested, and also serves to press a periphery of the floating member 5 to approach to the holder substrate 4.

In the conductive contact unit 1 having the above construction, the holder substrate 4, the floating member 5, and the base member 6 are formed of an insulation material. The insulation material may be a resin, such as polyamideimide, machinable ceramics, silicon, or the like.

Figure 5:
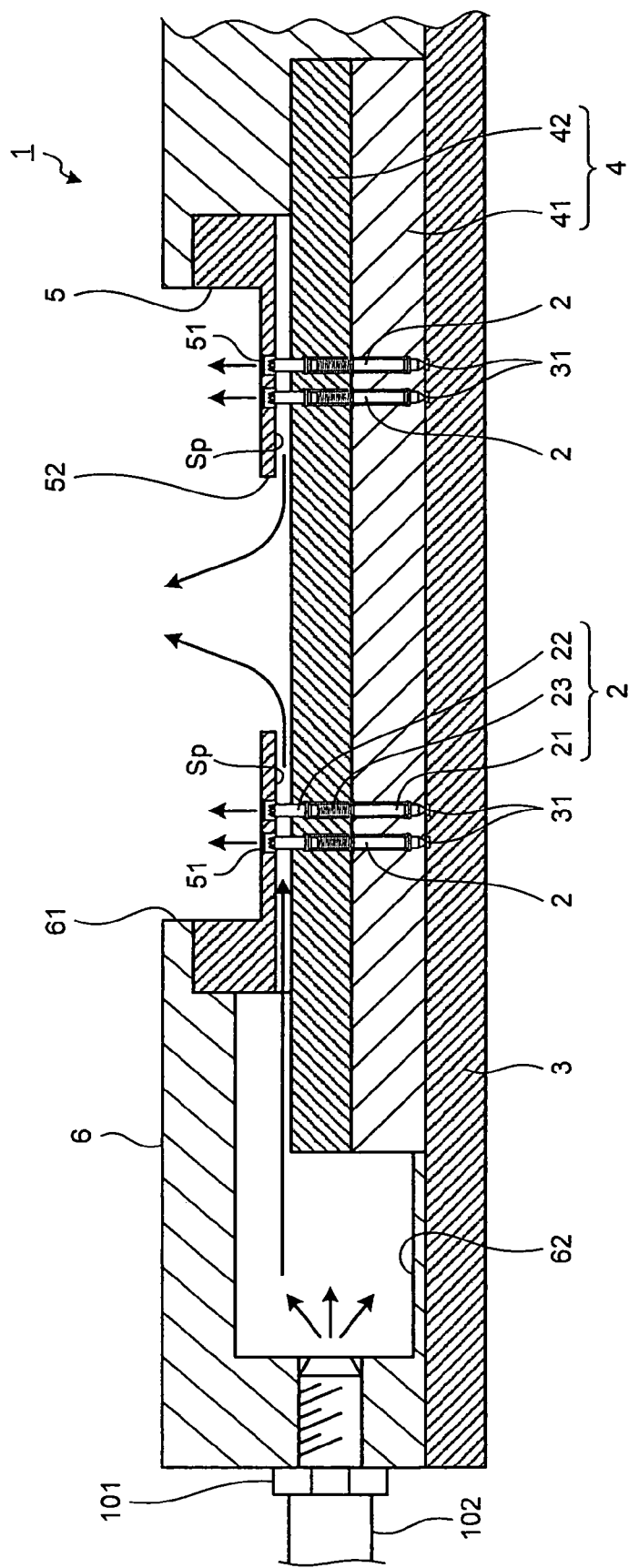
FIG. 5 is a schematic view illustrating air flow when air is introduced into a conductive contact unit 1 according to the first embodiment of the invention.

FIG. 5 is a schematic view illustrating air flow (arrowed line) when air generated by the air generator 103 is introduced into the conductive contact unit 1. The air generated in the air generator 103 and blown through the hose 102 and a front end of the nozzle 101 flows through the air passage 62 to the gap Sp between the second substrate 42 of the holder substrate 4 and the floating member 5, and then flows to the central region. Most of the flowed air flows out to the outside (to the upper side of FIG. 5) through the opening section 52 of the floating member 5. A portion of the air also flows out through the hole sections 51 of the floating member 5.

As such, it is possible to blow air on and around a front end of the second plunger 22 of the conductive contact 2. The front end of the second plunger 22 is a part that is brought into contact with the electrode of the semiconductor integrated circuit. Accordingly, by appropriately controlling temperature, flow velocity (flow rate), and pressure of air generated by the air generator 103 to decrease temperature difference from the temperature of the semiconductor integrated circuit, a sudden temperature change of the semiconductor integrated circuit can be prevented during the test, and thus the test can be performed in a precise temperature environment.

By introducing hot air into the gap Sp via the air passage 62, for example, it is possible to rapidly form a high temperature environment at and around the conductive contact unit 1 in a hot load test. Furthermore, as in an electric conduction test of a high frequency circuit, even when large current flows so that heat is generated at the conductive contact 2, rapid cooling can be performed on and around the heat generating conductive contact 2 by introducing air from the outside.

According to the first embodiment of the invention described above, the floating member is attached to the holder substrate such that the distance from the surface of the holder substrate, which receives the conductive contacts, is varied within a predetermined range by an external force, and the gap between the floating member and the holder substrate forms at least a part of the flow passage for the fluid introduced from the outside. Consequently, by flowing fluid of temperature nearly the same as that of the circuit structure to be tested through the gap, the temperature of the conductive contact is allowed to approach to that of the circuit structure to be tested. As a result, it becomes possible to prevent sudden temperature change of the semiconductor integrated circuit during the test, and to perform the test in a precise temperature environment.

In addition, according to the first embodiment, by providing an opening section penetrating the floating member in a thickness direction of the floating member, the fluid flowing through the gap between the floating member and the holder substrate efficiently flows out.

Further, according to the first embodiment, by controlling the air generator, the state of the fluid in the conductive contact unit can be arbitrary set. Accordingly, the temperature of the conductive contact can be set to an optimum value in the test, based on temperature distribution in the holder obtained by fluid analysis.

Modified Examples

Figure 6:
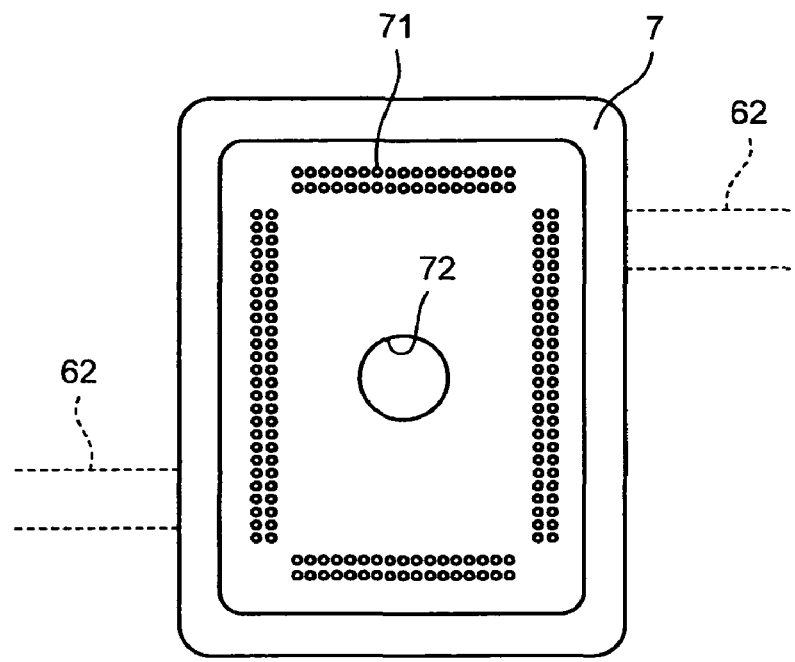
FIG. 6 is a schematic view illustrating a construction of a floating member applied to a conductive contact unit according to a first modification of the first embodiment of the invention.

FIG. 6 is a schematic view illustrating a construction of a floating member applied to a conductive contact unit according to a first modification of the first embodiment. A floating member 7 shown in FIG. 6 includes a plurality of hole sections 71 and an opening section 72. The hole sections 71 are formed corresponding to the arrangement pattern of connection electrodes of a semiconductor integrated circuit. The opening section 72 allows to flow out air from a gap between the floating member 7 and the holder substrate 4, to the outside. The hole section 71 has the same construction as that of the hole section 51 of the floating member 5. However, the opening section 72 has an area smaller than that of the opening section 52 of the floating member 5, and an opening surface thereof has a circular shape. In FIG. 6, the location of the air passage 62 of the base member 6 is indicated by broken lines. This will be the same in FIGS. 7 and 8 described below.

Figure 7:
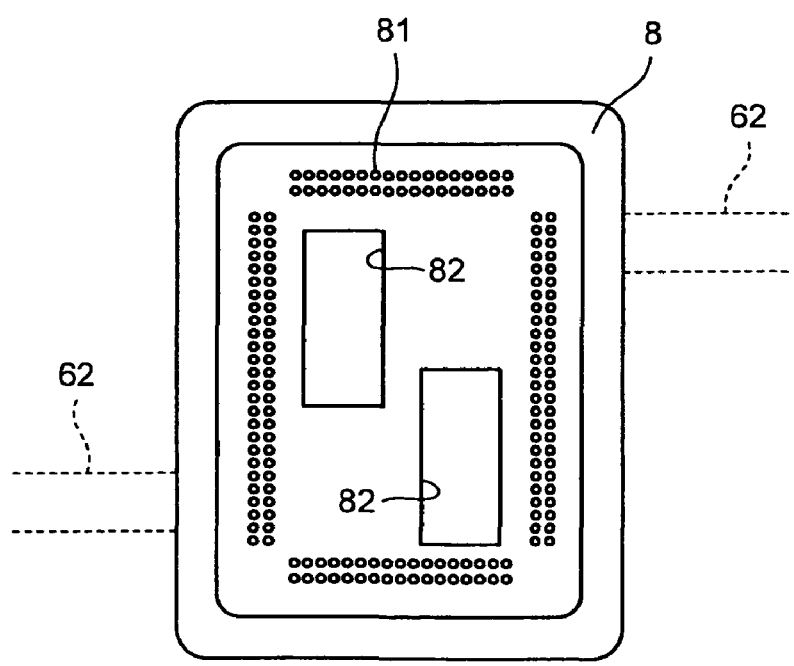
FIG. 7 is a schematic view illustrating a construction of a floating member applied to a conductive contact unit according to a second modification of the first embodiment of the invention.

FIG. 7 is a schematic view illustrating a construction of a floating member applied to a conductive contact unit according to a second modification of the first embodiment. A floating member 8 shown in FIG. 7 includes a plurality of hole sections 81 and two opening sections 82. The hole sections 81 are formed corresponding to the arrangement pattern of connection electrodes of a semiconductor integrated circuit. The opening sections 82 allow to flow out air from a gap between the floating member 8 and the holder substrate 4, to the outside.

The hole section 81 has the same construction as that of the hole section 51 of the floating member 5. However, the opening section 82 has an area smaller than that of the opening section 52 of the floating member 5, and has a rectangular shape. The two opening sections 82 are 180 degree rotationally symmetric about an axis passing through a center of the surface of the floating member 8 and perpendicular to the surface of the floating member 8. In addition, each of the opening sections 82 is disposed at a location crossing an extension direction of one of the two air passages 62.

Figure 8:
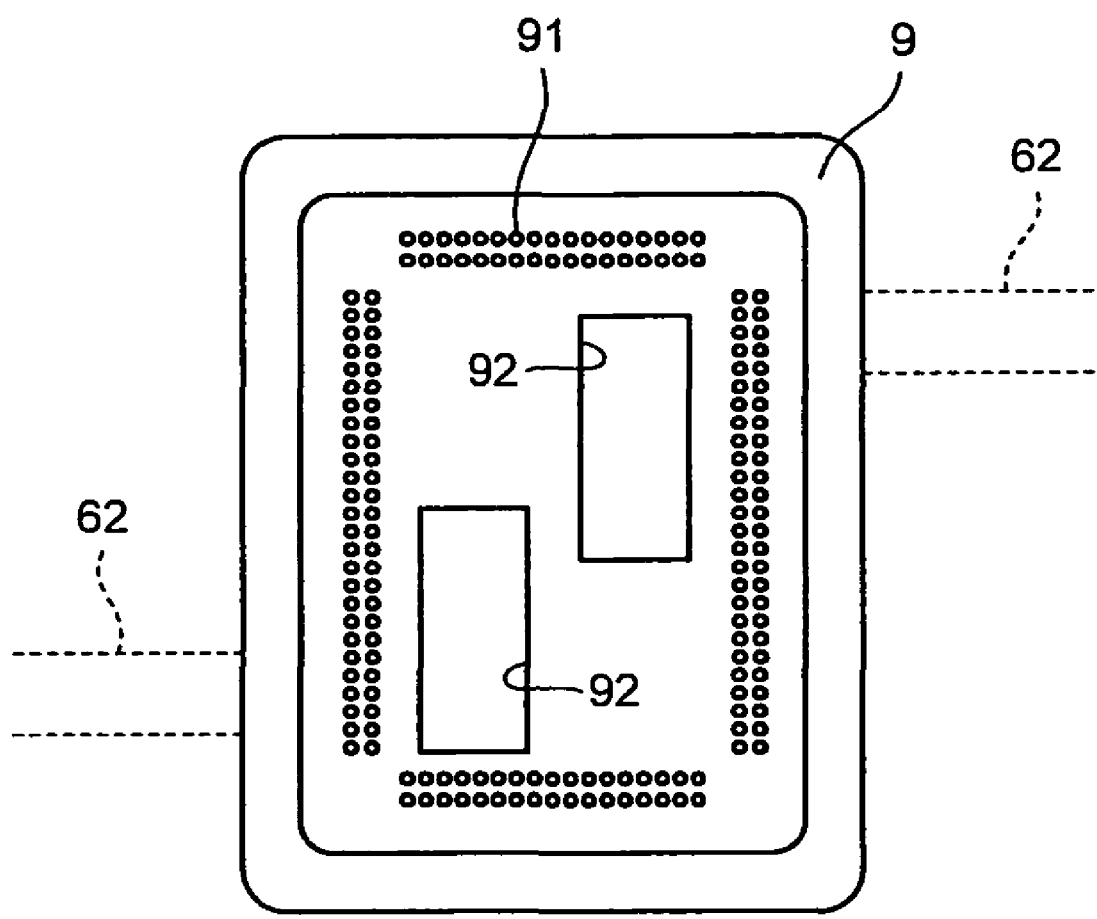
FIG. 8 is a schematic view illustrating a construction of a floating member applied to a conductive contact unit according to a third modification of the first embodiment of the invention.

FIG. 8 is a schematic view of a floating member applied to a conductive contact unit according to a third modification of the first embodiment. A floating member 9 shown in FIG. 8 includes a plurality of hole sections 91 and two opening sections 92. The hole sections 91 are formed corresponding to the arrangement pattern of connection electrodes of a semiconductor integrated circuit. The opening sections 92 allow to flow out air from a gap between the floating member 9 and the holder substrate 4, to the outside.

The hole section 91 has the same construction as that of the hole section 51 of the floating member 5. In addition, the opening section 92 has the same shape as that of the opening section 82 of the floating member 8. The two opening sections 92 are 180 degree rotationally symmetric about an axis passing through a center of the surface of the floating member 9 and perpendicular to the surface of the floating member 9. Like the opening section 82 of FIG. 7, each of the two opening sections 92 is disposed at a location crossing an extension direction of one of the two air passages 62. The distance between the center of the opening section 92 and an outlet of the air passage 62 adjacent to the opening section 92 is shorter than the distance between the center of the opening section 82 of FIG. 7 and an outlet of the air passage 62 adjacent to the opening section 82.

The optimum type of the floating member 5, 7 to 9 varies depending on conditions such as test temperature, and shape of the test target. In addition, the shape, size, number, and location of the opening section of the floating member are not limited to the above.

Figure 9:
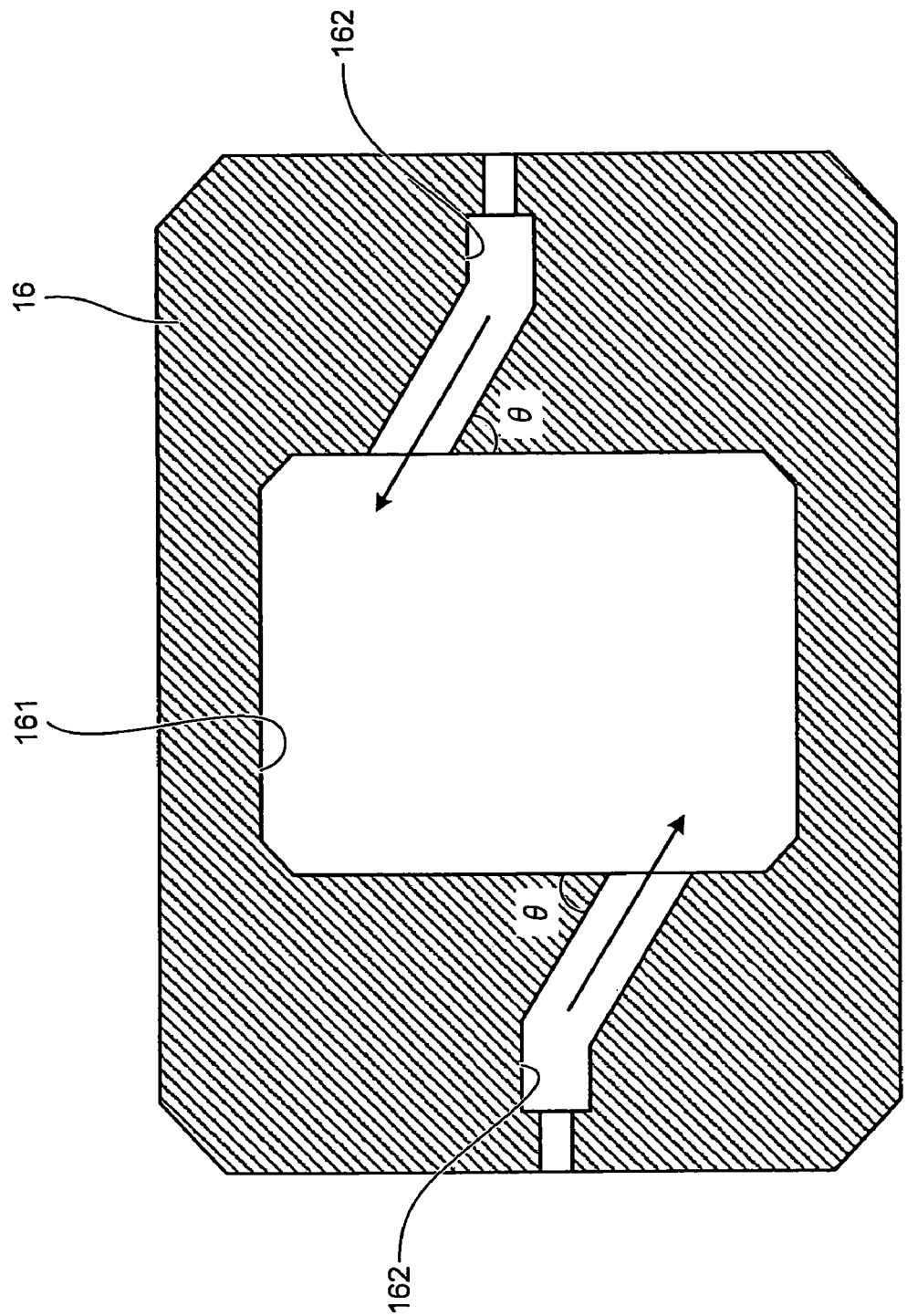
FIG. 9 is a schematic view illustrating a construction of a base member applied to a conductive contact unit according to a fourth modification of the first embodiment of the invention.

FIG. 9 is a view illustrating an internal construction of a base member applied to a conductive contact unit according to a fourth modification of the first embodiment, and is a sectional view (cross sectional view) taken along a plane which passes through a center of a plane thickness of the base member and is perpendicular to a direction of plate thickness. Referring to FIG. 9, in the center region, a base member 16 is provided with an opening section 161 capable of covering and fitting each periphery of the holder substrate 4 and the floating member 5.

In the base member 16, two air passages 162 are formed, which penetrate the base member 16 from an outer side thereof to an inner side on the side of the opening section 161 and receives air from the outside. The two air passages 162 extend in parallel, but central axes of the two air passages 162 are shifted. In addition, the extension direction of the air passage 162 near the opening section 161 is at an acute angle (θ) to a side surface of the opening section 161. As such, by changing a direction in which air is introduced into the opening section 161, the direction of air flow in the gap Sp between the holder substrate 4 and the floating member 5 can become different from that of the first embodiment, and the air flow in the gap Sp can be controlled more appropriately. Also, the temperature distribution in the gap Sp as well as the temperature of the conductive contact 2 can be controlled to a desired temperature.

In the fourth modification, constructions other than that of the base member 16 are the same as those of the first embodiment. The floating member 5 may also be replaced by one of the floating members 7 to 9 described in the first to third modifications.

Figure 10:
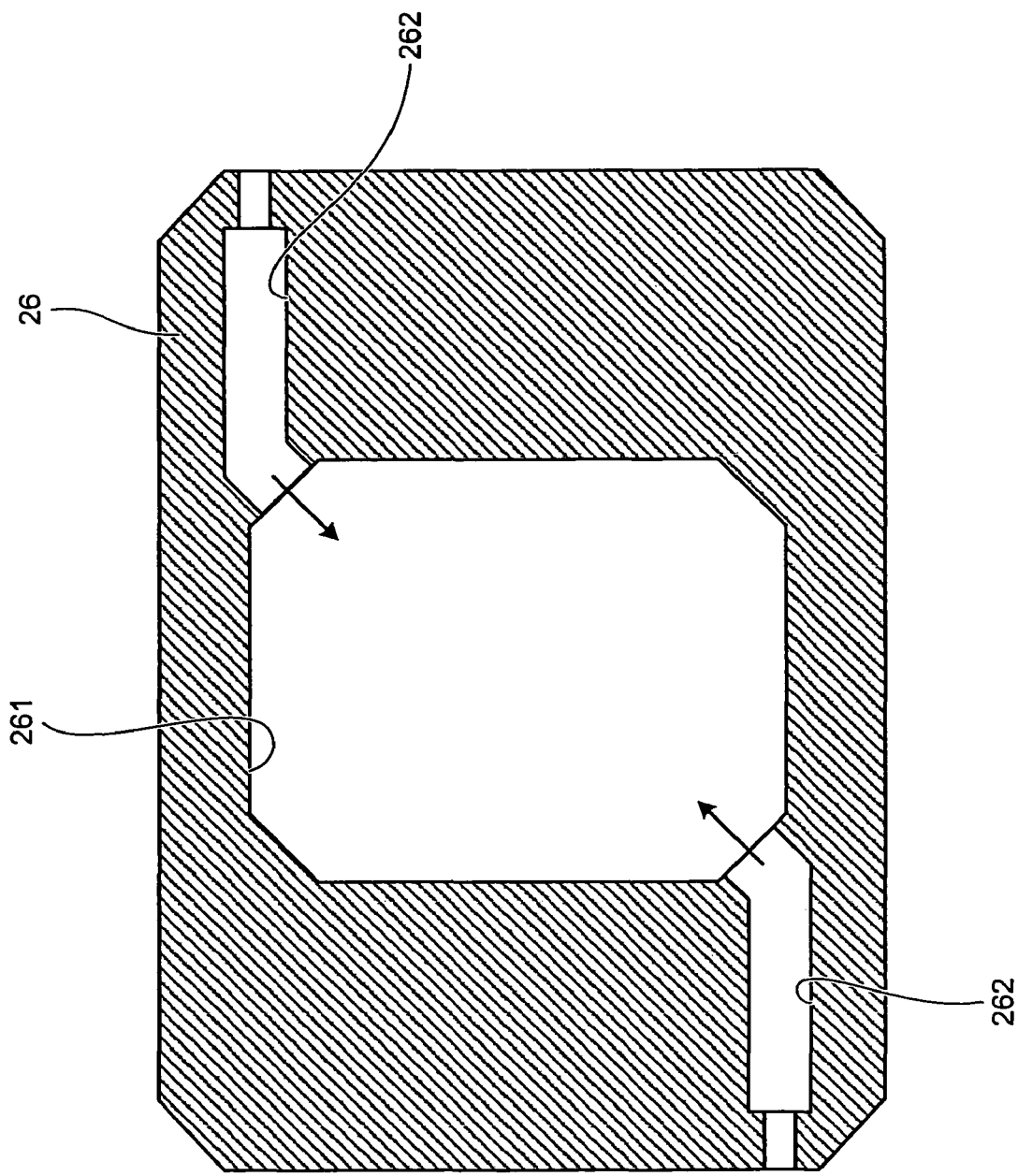
FIG. 10 is a schematic view illustrating a construction of a base member applied to a conductive contact unit according to a fifth modification of the first embodiment of the invention.

FIG. 10 is a view illustrating an internal construction of a base member applied to a conductive contact unit according to a fifth modification of the first embodiment, and is a sectional view (cross sectional view) taken along a plane which passes through a center of a plane thickness of the base member and is perpendicular to a direction of plate thickness. Referring to FIG. 10, in the center region, a base member 26 is provided with an opening section 261 capable of covering and fitting each periphery of the holder substrate 4 and the floating member 5.

The base member 26 is provided with two air passages 262 for introducing air from the outside, which penetrates two respective corners of the opening section 261 diagonally positioned. The two air passages 262 extend in parallel, but central axes of the two air passages 262 are shifted. In the modification, the air passages 262 are disposed at two respective corners of the opening section 261 diagonally positioned, respectively. Accordingly, it is possible to provide smooth air flow (cyclone air flow) in the conductive contact unit, and to realize more uniform temperature distribution.

In the fifth modification, constructions other than that of the base member 26 are the same as those of the first embodiment. The floating member 5 may also be replaced by one of the floating members 7 to 9 described in the first to third modifications.

Second Embodiment

Figure 11:
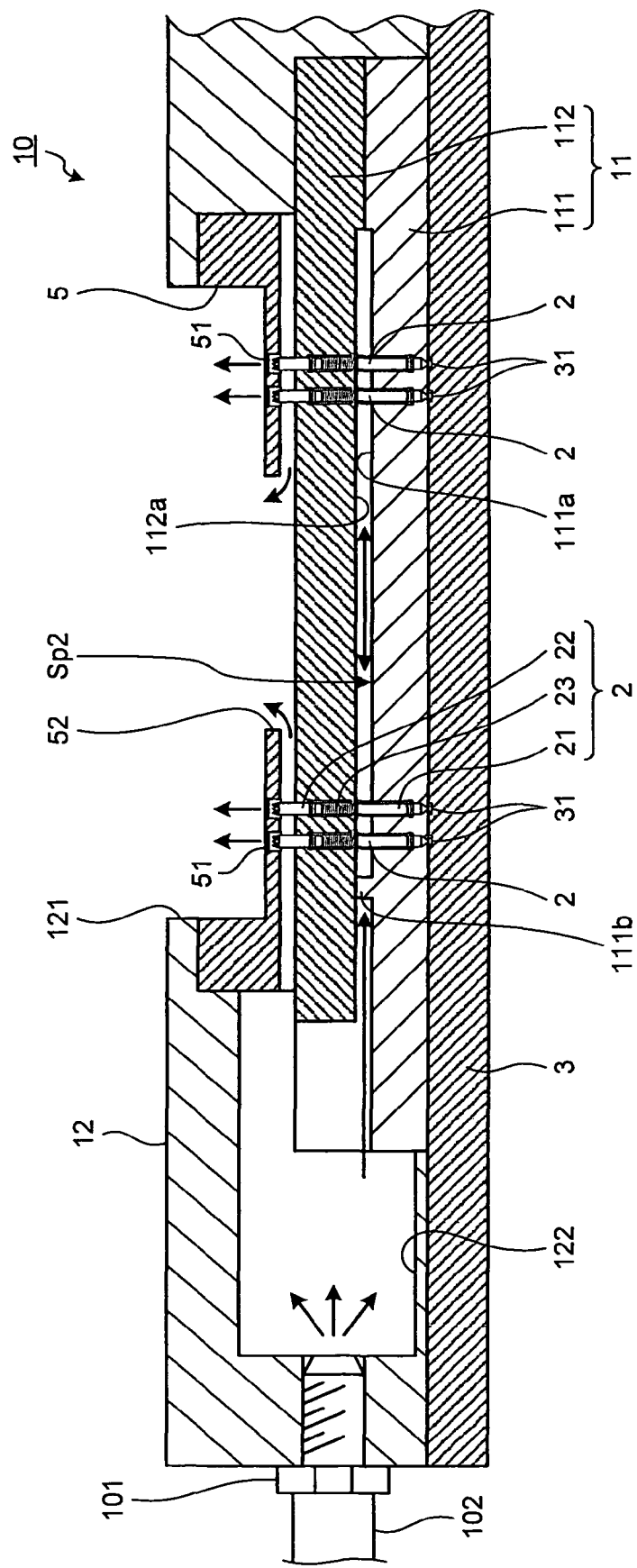
FIG. 11 is a partial cross-sectional view illustrating a construction of a conductive contact unit according to a second embodiment of the invention.

FIG. 11 is a partial cross-sectional view of a conductive contact unit according to a second embodiment of the invention. A conductive contact unit 10 shown in FIG. 11 has a holder substrate and a base member having different constructions from those of the conductive contact unit 1 of the first embodiment. In addition, an air generator is connected to only one air passage. Other than the above, the conductive contact unit 10 has the same constructions as those of the conductive contact unit 1, and like reference numerals refer to like elements.

A holder substrate 11 includes a first substrate 111 and a second substrate 112 stacked in a direction of plate thickness. Top surface of the first substrate 111 and bottom surface of the second substrate 112 are provided with recess sections 111a and 112a, respectively. The recess sections 111a and 112a form a gap Sp2 between the first substrate 111 and the second substrate 112 stacked in a direction of plate thickness. The recess section 111a of the first substrate 111 is provided with a protrusion section 111b protruding in a direction perpendicular to a bottom surface. A top surface of the protrusion section 111b is in contact with the recess section 112a of the second substrate 112 when the first substrate 111 and the second substrate 112 are stacked (see FIG. 11). The shape and location of the protrusion section 111b will be described below.

Figure 12:
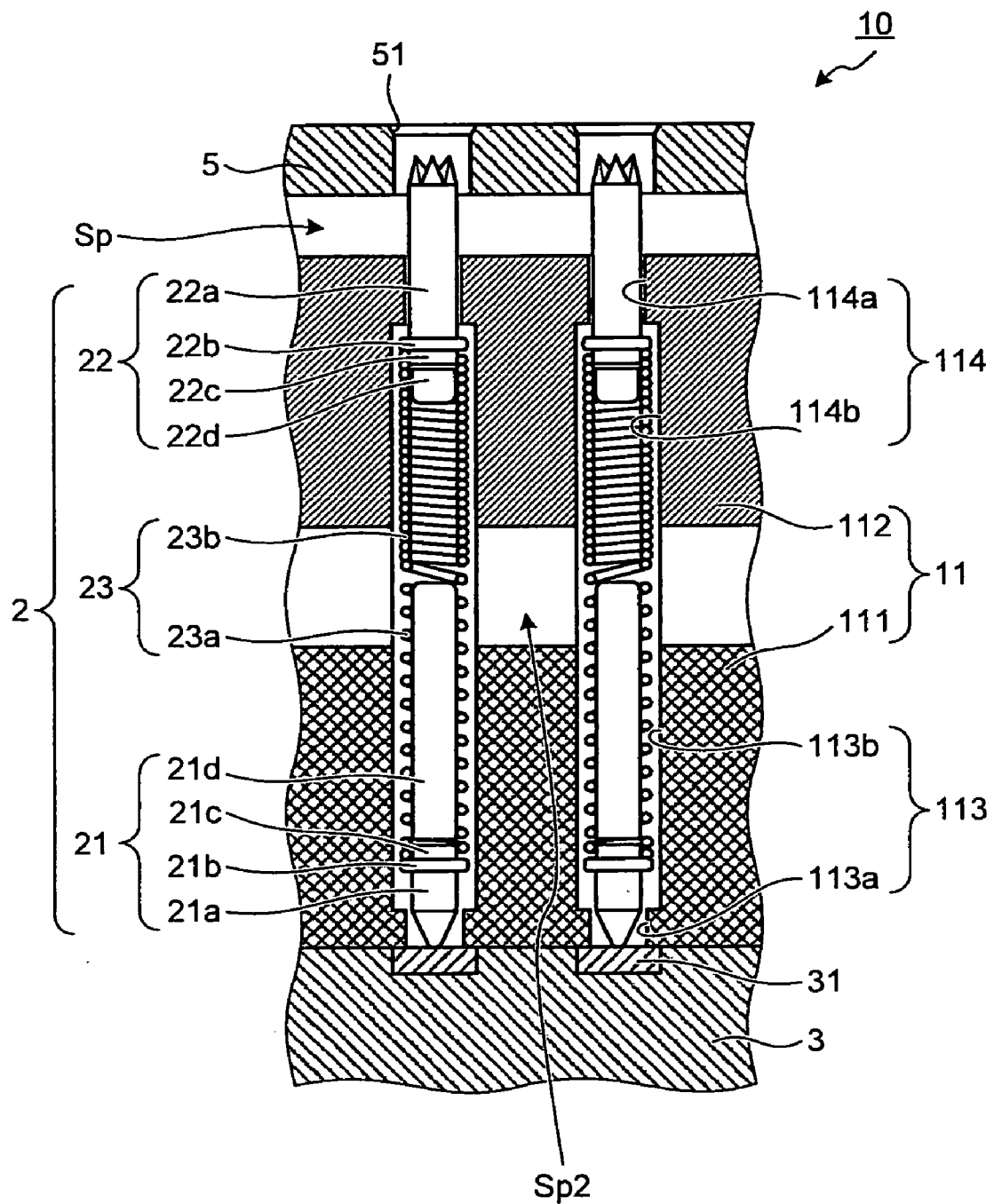
FIG. 12 is an enlarged cross-sectional view around a portion of a conductive contact unit, at which a conductive contact is held, according to the second embodiment of the invention.

FIG. 12 is an enlarged cross-sectional view around a portion of the holder substrate 11 receiving the conductive contact 2. The first substrate 111 is provided with a plurality of holder holes 113 and the second substrate 112 is provided with a plurality of holder holes 114. The holder holes 113 or the holder holes 114 receive the same number of conductive contacts 2. Here, the holder holes 113 and 114 receiving the same conductive contact 2 are aligned coaxially. The locations of the holder holes 113 and 114 depend on the line pattern of the semiconductor integrated circuit.

The holder holes 113 and 114 each has a stepped hole shape with different diameters along a penetration direction. That is, the holder hole 113 includes a small diameter hole 113a with an opening facing the circuit substrate 3, and a large diameter hole 113b with a diameter larger than the small diameter hole 113a. Meanwhile, the holder hole 114 includes a small diameter hole 114a with an opening facing the floating member 5, and a large diameter hole 114b with a diameter larger than the small diameter hole 114a. The shapes of the holder holes 113 and 114 depend on the construction of the conductive contact 2 to be received therein.

In the center region of a base member 12, an opening section 121 is provided so as to mount a semiconductor integrated circuit on the conductive contact unit 10 and to cover and fit peripheries of the holder substrate 11 and the floating member 5.

The base member 12 is provided with two air passages 122. Air is introduced through one air passage 122, and flows out through the other air passage 122. The two air passages 122 extend in parallel, but central axes of the two air passages 122 are shifted. In the second embodiment, the nozzle 101 for introducing air is coupled to one of the air passages 122. The nozzle 101 is coupled to the air generator 103 via the hose 102, and air generated by the air generator 103 is blown and introduced into the air passage 122. The other air passage 122 is open to the outside for outflow of air.

Figure 13:
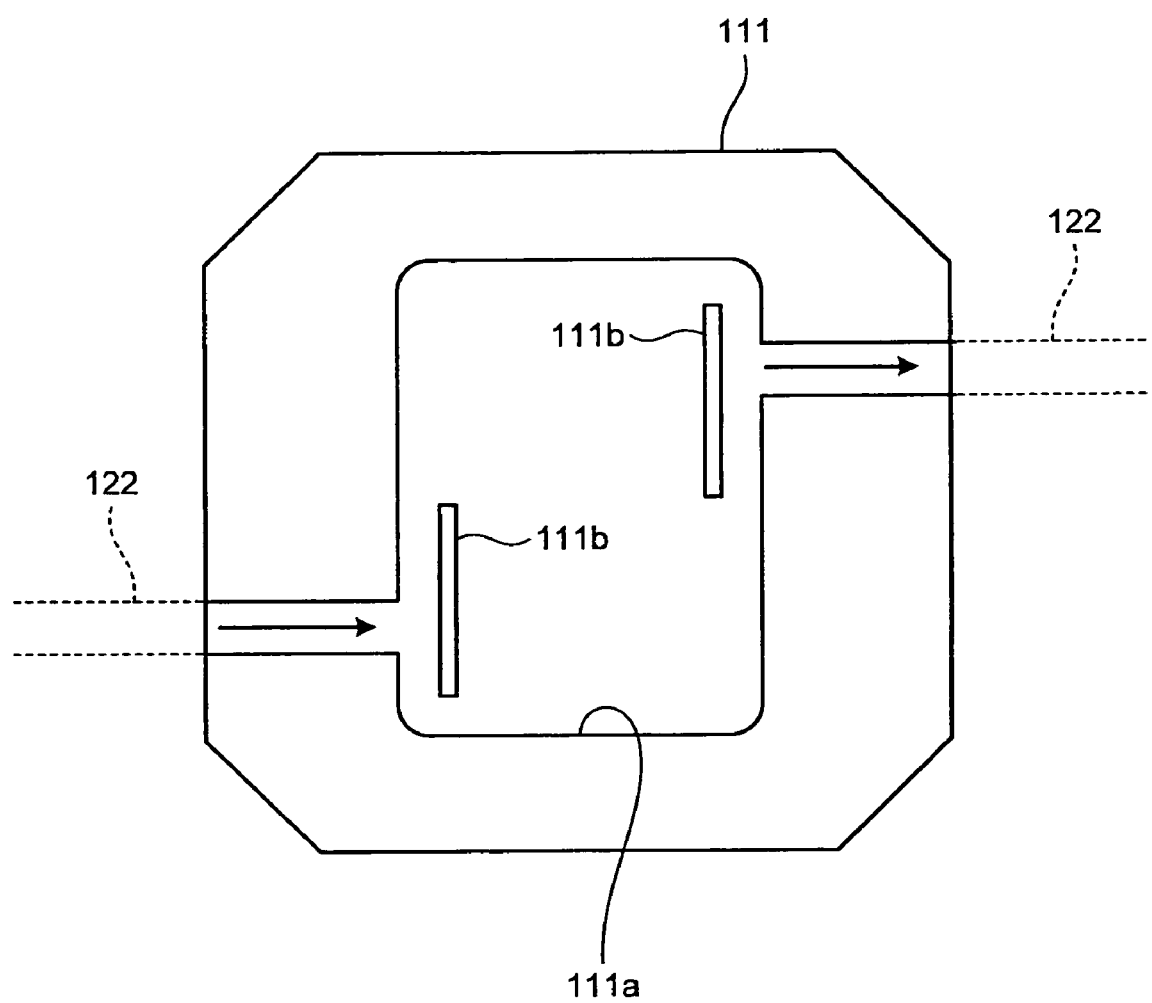
FIG. 13 is a plan view of a first substrate that forms a holder substrate of a conductive contact unit according to the second embodiment of the invention.

FIG. 13 is a plan view of the first substrate 111. The plan view illustrates a construction on an upper side of FIG. 11. As illustrated in FIG. 13, each of two protrusion sections 111b protruding from the first substrate 111 is formed at a location crossing an extension direction of one of two air passages 122. The protrusion section 111b protrudes and extends in a direction perpendicular to the extension direction of the air passages 122.

Air introduced from the air passage 122 at a lower left side enters the recess section 111a, and then collided with the corresponding protrusion section 111b. The air collided with the protrusion sections circulates behind the protrusion section 111b, flows in a gap Sp2 between the recess section 111a and the recess section 112a of the second substrate 112, and flows to be sucked into the air passage 122 at an upper right side. The protrusion section 111b is also formed near the air passage 122 at the upper right side. Accordingly, suction is performed efficiently into the air passage 122 at the upper right side of FIG. 13, thereby realizing outflow of the air to the outside.

The air, which flows in the gap Sp2, also flows out through the hole section 51 and the opening section 52 of the floating member 5 via a holder hole 114 and a gap Sp, however, the outflow amount is smaller than that in the first embodiment.

According to the second embodiment of the invention described above, the gap between the first and second substrates of the holder substrate forms a main air passage for the fluid introduced from the outside. Consequently, by introducing fluid, of which a temperature is nearly equal to that of the circuit structure to be tested, into the gap, the temperature of the conductive contact can be made to approach to that of the circuit structure to be tested. As a result, it is possible to prevent sudden temperature change of the semiconductor integrated circuit during the test, and to perform the test in a precise temperature environment.

Also, according to the second embodiment, by forming the protrusion section protruding in a direction of height of the gap from at least one of the first and second substrates, on the gap formed between the first and second substrates that form the holder substrate, it is possible to control the flow of the fluid in the gap between the first and second substrates, and to control the temperature more precisely.

The protrusion section may protrude and extend in a direction at a predetermined angle with respect to the extension direction of the air passage 122, instead of protruding and extending in a direction perpendicular to the extension direction of the air passage 122.

The protrusion section may be formed on the second substrate side.

Further, in the second embodiment, an opening section may be formed at a nearly central portion of the second substrate 112 of the holder substrate 11 to thereby secure an air outlet to the outside. In the case, it is preferable that the opening section has an appropriate opening area not to cause a problem to the strength of the holder substrate 11.

Furthermore, in the second embodiment, air suction may be performed by fixing a nozzle to an air passage that is open to the external air, and coupling a vacuum pump to the nozzle via a hose connected to the nozzle.

Although only one air passage is used for air introduction in the second embodiment, it is also possible that two air passages are used for air introduction, like in the first embodiment.

Other Embodiments

While best modes for carrying out the invention have been described in detail hereabove, the invention is not limited to the two embodiments.

In the invention, the location of the air passage is different depending on the conditions, such as the arrangement of the conductive contacts and a required temperature. In the first and second embodiments, a conductive contact unit applied to a test of a surface-mounted package from which a lead is extracted, such as a quad flat package (QFP), was described for example. However, the invention may also be applicable to a surface-mounted package where nearly spherical electrodes such as ball grid array (BGA) are regularly arranged. When the invention is applied to a test of a BGA and the like, it is hard to provide an opening section at a center of the floating member, in general. However, similar effects can be achieved by outflow of air through a hole section of a conductive contact.

Also, in the invention, a base member may be provided with three or more air passages. In the case, all air passages may extend in parallel, and central axes of the air passages may be shifted from each other.

Further, in the invention, the conductive contact unit 10 of the second embodiment may not include the floating member 5.

Furthermore, in the invention, the above-described constructions of the conductive contacts are merely provided as an example, and the invention may also be applied to conductive contacts having other constructions.

As described above, the invention may include various embodiments that are not described herein, and various changes may be made without departing from the spirit and scope of the invention as defined by the appended claims.

INDUSTRIAL APPLICABILITY

As described above, the conductive contact holder and the conductive contact unit according to the invention are suitable to hold a conductive contact used in the electric conduction test of a circuit structure, such as a semiconductor integrated circuit.

The invention claimed is:

1. A conductive contact holder that supports a plurality of conductive contacts for electrically connecting different circuit structures to input and output signals, the conductive contact holder comprising:
    a holder substrate capable of individually receiving the conductive contacts; and
    a floating member attached to the holder substrate such that a distance from a surface of the holder substrate is varied within a predetermined range by an external force, the floating member having a plurality of hole sections into which a front end section of each of the conductive contacts received by the holder substrate is inserted,
    wherein a gap between the holder substrate and the floating member forms at least a part of a passage of fluid introduced from outside of the conductive contact holder; and,
    wherein the holder substrate includes first and second substrates that are tabular-shaped and stacked in a direction of plate thickness, and a gap formed between the stacked first and second substrates forms at least a part of the passage of fluid introduced from the outside of the conductive contact holder.

2. The conductive contact holder according to claim 1, wherein the holder substrate includes a protrusion in the gap formed between the first and second substrates, the protrusion protruding in a height direction of the gap from at least one of the first and second substrates.

3. The conductive contact holder according to claim 1, wherein the floating member has an opening section penetrating the floating member in a thickness direction.

4. A conductive contact unit comprising:
    a plurality of conductive contacts for electrically connecting different circuit structures to input and output signals;
    a conductive contact holder according to claim 1; and a base member having an opening section, into which one of the circuit structures electrically connected by the conductive contacts is mountable, and an inlet of the fluid introduced from the outside to the conductive contact holder, wherein the base member applies a load to the floating member in a direction toward the holder substrate.

5. The conductive contact unit according to claim 4, further comprising a fluid generator that generates the fluid introduced to the conductive contact holder through the inlet of the base member, wherein the fluid generator generates the fluid having a temperature in a temperature range that is set for the circuit structure mounted into the opening section of the base member.

6. The conductive contact unit according to claim 4, wherein the base member has a plurality of the inlets that have portions adjacent to the conductive contact holder, the portions extending in parallel and central axes thereof being shifted from each other.

7. The conductive contact unit according to claim 6, further comprising a fluid generator that generates the fluid introduced to the conductive contact holder through the inlet of the base member, wherein the fluid generator generates the fluid having a temperature in a temperature range that is set for the circuit structure mounted into the opening section of the base member.

* * * * *